United States Patent
de Rooij et al.

(10) Patent No.: US 10,892,650 B2
(45) Date of Patent: Jan. 12, 2021

(54) MULTI-COIL LARGE AREA WIRELESS POWER SYSTEM

(71) Applicant: Efficient Power Conversion Corporation, El Segundo, CA (US)

(72) Inventors: Michael A. de Rooij, Playa Vista, CA (US); Yuanzhe Zhang, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 241 days.

(21) Appl. No.: 16/113,714

(22) Filed: Aug. 27, 2018

(65) Prior Publication Data

US 2019/0068000 A1    Feb. 28, 2019

Related U.S. Application Data

(60) Provisional application No. 62/550,920, filed on Aug. 28, 2017.

(51) Int. Cl.
    *H02J 50/40*      (2016.01)
    *H03F 3/217*      (2006.01)
    (Continued)

(52) U.S. Cl.
    CPC .............. *H02J 50/40* (2016.02); *H02J 50/12* (2016.02); *H03F 3/2173* (2013.01);
    (Continued)

(58) Field of Classification Search
    CPC ...................... H04B 5/0037; B60L 53/12–126
    See application file for complete search history.

(56) References Cited

U.S. PATENT DOCUMENTS 9,231,411 B2    1/2016    Baarman et al.
9,331,061 B2    5/2016    de Rooij et al.
(Continued)

FOREIGN PATENT DOCUMENTS

CN     103308948 A    9/2013
CN     206237208 U    6/2017
(Continued)

OTHER PUBLICATIONS

"Differential signaling", Aug. 12, 2017, Wikipedia, retrieved via Wayback machine at <https://web.archive.org/web/20170812222221/https://en.wikipedia.org/wiki/Differential_signaling> (Year: 2017).*

*Primary Examiner* — Rexford N Barnie
*Assistant Examiner* — Davd A Shiao
(74) *Attorney, Agent, or Firm* — Blank Rome LLP

(57) ABSTRACT

A large area wireless power system having a synchronization transmitter and a plurality of synchronization receivers for receiving a plurality of differential signals from the synchronization transmitter and outputting a plurality of second single-ended signals. The synchronization transmitter generates a first single-ended signal and converts the first single-ended signal into the plurality of differential signals to be transmitted to the synchronization receivers over a plurality of differential line pairs that also provide power to the synchronization receivers. The large area wireless power system also includes a plurality of high power amplifiers for receiving the plurality of second single-ended signals from the respective synchronization receivers and generating power, and a plurality of wireless power coils for receiving the power generated by the plurality of high power amplifiers and wirelessly providing power.

17 Claims, 12 Drawing Sheets

(51) Int. Cl.
*H02J 50/12* (2016.01)
*H04L 25/02* (2006.01)
*H04B 3/50* (2006.01)

(52) U.S. Cl.
CPC ............. *H03F 3/2176* (2013.01); *H04B 3/50* (2013.01); *H04L 25/0272* (2013.01)

(56) References Cited

U.S. PATENT DOCUMENTS

| | | | |
|---|---|---|---|
| 9,360,442 B2 | 6/2016 | Miyamoto et al. | |
| 2007/0069943 A1 | 3/2007 | Adams et al. | |
| 2011/0133570 A1* | 6/2011 | Mayo | H03F 3/2176 307/104 |
| 2013/0040586 A1 | 2/2013 | Oliaei et al. | |
| 2013/0154383 A1* | 6/2013 | Kasturi | H02J 5/005 307/104 |
| 2013/0159956 A1 | 6/2013 | Verghese et al. | |
| 2013/0223315 A1* | 8/2013 | Yoshida | H04B 3/542 370/311 |
| 2013/0293025 A1 | 11/2013 | Xu et al. | |
| 2014/0103881 A1 | 4/2014 | Mohammadian et al. | |
| 2014/0191568 A1 | 7/2014 | Partovi | |
| 2014/0273833 A1* | 9/2014 | McCormack | H04B 5/0037 455/41.1 |
| 2015/0069854 A1* | 3/2015 | Kim | H02J 5/005 307/104 |
| 2015/0236844 A1* | 8/2015 | Pan | H04J 3/06 370/503 |
| 2016/0087481 A1* | 3/2016 | Jiang | H02J 50/10 320/108 |
| 2016/0111894 A1* | 4/2016 | Bishtein | H03F 1/0294 307/104 |
| 2016/0226294 A1* | 8/2016 | Ha | H02J 7/025 |
| 2017/0085132 A1* | 3/2017 | Yeo | H02J 50/70 |
| 2017/0149282 A1 | 5/2017 | Menegoli et al. | |
| 2018/0212452 A1* | 7/2018 | Chou | H02J 7/025 |
| 2018/0269725 A1* | 9/2018 | Yeo | H02J 50/40 |

FOREIGN PATENT DOCUMENTS

| | | |
|---|---|---|
| TW | 201101643 A | 1/2011 |
| TW | 201415752 A | 4/2014 |

* cited by examiner

MULTI-COIL LARGE AREA WIRELESS POWER SYSTEM

This application claims the benefit of U.S. Provisional Application No. 62/550,920, filed on Aug. 28, 2017, the contents of which is hereby incorporated by reference.

TECHNICAL FIELD

The present invention relates to a power system for wireless charging over a large area via multiple highly resonant wireless power coils, and synchronizing the signals provided to the power coils.

BACKGROUND

Recently, there have been many developments in wireless power transmission systems (also referred to as "wireless energy transfer systems") using highly resonant electromagnetic induction. In general, such systems include a power source and transmitting coil as well as a receiving coil connected to the device to be powered (i.e., the load). The architecture for wireless power transmission systems is centered on the use of coils to generate a high frequency alternating magnetic field that is used to transfer energy from the source to the load. The power source will deliver energy in the form of voltage and current to the transmitting coil that will create a magnetic field around the coil that changes as the applied voltage and current changes. Electromagnetic waves will travel from the coil, through free space to a receiving coil coupled to the load. As the electromagnetic waves pass by the receiving coil, a current is induced in the receiving coil that is proportional to the energy that the receiving coil captures.

One known coil layout for a wireless power transmission system is a basic spiral loop. FIG. 1 shows a basic spiral loop coil. In the basic spiral loop coil, the inductance L of the coil is proportional to $N^2$, where N is the number of turns of the coil. This type of coil is typically used on smaller, low power systems, less than 20 W.

Another known coil layout is a basic interleaved spiral loop. FIG. 2 shows a basic interleaved spiral loop coil comprising two interleaved loop windings. One winding is shown as one continuous line. The other winding is shown as dashes. In FIG. 2, the two windings can be configured in series for high inductance or in parallel for low inductance. This type of loop coil is typically used on wireless power transmitters (i.e., power source side). The mirror image pattern shown in FIG. 2 provides near uniform magnetic field at the charge surface (a specific distance from the coil). This type of loop coil is used for medium power applications (up to 70 W systems). The physical size of the coil is limited to approximately a 12 inch square.

Other coil layouts are disclosed in U.S. patent application Ser. No. 15/922,286, filed Mar. 15, 2018, the entirety of which is incorporated by reference herein. One example is the coil layout shown in FIG. 3. FIG. 3 shows multiple loops formed into a coil cluster formed using a single coil 10 of multiple loops on a PCB. The single coil 10 is wound on a PCB to form a pattern of multiple circular loops. The multiple circular loops are connected in series. The coil cluster is provided to maintain its pattern of multiple circular loops, wherein the loops are equidistant from each adjacent loops, in both horizontal and vertical directions. This allows the patterns of the coil loops to be maintained when the coil clusters are overlapping so that coil clusters are decoupled with other coil clusters. This also allows each adjacent loop of the connected coil clusters to be decoupled from each other. With the decoupling of the loops, the inductance resulting from the combination of small loops, connected in series, is relatively low in comparison to an equivalent sized winding coil. Low induction coils are advantageous in wireless power transfer because of the lower impact of the environment on imaginary impedance variation.

Problems can arise with these wireless power systems when used to provide power to a large area. For example, as the coil area increases, the radiated magnetic field increases in volume which can result in increased specific absorption rate (SAR) into living tissue and increased EMI radiation levels that make it more difficult to comply with radiated emissions limits.

Another effect of a large coil area is the increase in inductance and, therefore, tuning the coil to the fixed industrial, scientific and medical (ISM) band for highly resonant wireless power applications of 6.78 MHz requires ever decreasing capacitance. Smaller capacitances magnify the effect of tolerances, making it difficult and impractical in production to maintain resonance. High inductance also results in high voltage stress across the tuning capacitors. This voltage can easily exceed 1000 V.

A secondary effect of large area coils is that they become ever more susceptible to imaginary impedance shifting due to use case variations, such as the presence of foreign metal objects, capacitive coupling from devices (loads) and load power demand.

Another issue is that the high frequency (6.78 MHz) amplifiers typically used for large area coils have limits on maximum output power due to device voltage rating and design limits, even when using higher voltage and/or current FETs.

Accordingly, it would be desirable to provide a large area wireless power system that overcomes the above-noted issues.

SUMMARY OF THE INVENTION

In one embodiment, a large area wireless power system is provided that includes multiple coils. Because timing distortion and jitter can become an issue when providing power to multiple coils over longer distances, a synchronization circuit is provided to reduce timing distortion and jitter. The synchronization circuit may also compensate for phase delay in the signals, so that the signals provided to the coils are in-phase, or at least within any maximum phase delay threshold. Ensuring that the signals are in-phase is crucial for large loads that may receive power from more than one coil.

In an exemplary embodiment, the large area wireless power system has a synchronization transmitter and a plurality of synchronization receivers for receiving a plurality of differential signals from the synchronization transmitter and outputting a plurality of second single-ended signals. The synchronization transmitter generates a first single-ended signal and converts the first single-ended signal into a plurality of differential signals. The large area wireless power system also includes a plurality of high power amplifiers for receiving the plurality of second single-ended signals from the respective synchronization receivers and generating power, and a plurality of wireless power coils for receiving the power generated by the plurality of high power amplifiers and wirelessly providing power.

In another embodiment, the large area wireless power system includes a resonant large area coil, a smaller induction coil and a high current amplifier for supplying power to the induction coil to thereby cause the induction coil to induce a magnetic field into the resonant large area coil. The high current amplifier may, for example, be configured as two differential-mode ZVS class D amplifiers arranged in parallel using current balancing inductors, or may be configured as two differential-mode class E amplifiers arranged in parallel.

In another embodiment, the large area wireless power system includes a large area coil and a high-voltage amplifier for providing power to the large area coil. The high-voltage amplifier includes a plurality of ZVS class D amplifiers stacked in a multi-level configuration, and each of the ZVS class D amplifiers is synchronously switched.

An amplifier circuit is also described, which provides high power to a wireless power coil. The amplifier circuit includes a differential receiver for receiving a differential signal from a differential driver, and converting the signal to a single-ended signal. The amplifier circuit further includes an isolated driver for receiving the single-ended signal and isolating the differential receiver and a high power amplifier for receiving the single-ended signal and providing power to the wireless power coil. The amplifier circuit also includes a delay compensation circuit for compensating for any phase delay in the single-ended signal before the signal is provided to the high power amplifier.

A synchronization circuit for synchronizing a plurality of power signals provided to a plurality of power coils is also described. The synchronization circuit includes an oscillator for generating a single-ended signal and a synchronization transmitter for converting the single-ended signal to a plurality of differential signals. The synchronization circuit further includes a plurality of synchronization receivers for receiving the plurality of differential signals from the synchronization transmitter and converting the plurality of differential signals to a plurality of synchronized single-ended signals. The synchronization circuit also includes a delay compensation circuit for compensating for phase delay in the plurality of synchronized single-ended signals.

Other features and advantages of the invention will become apparent when the following description is read in conjunction with the accompanying drawings.

DETAILED DESCRIPTION OF THE INVENTION

Figure 1:
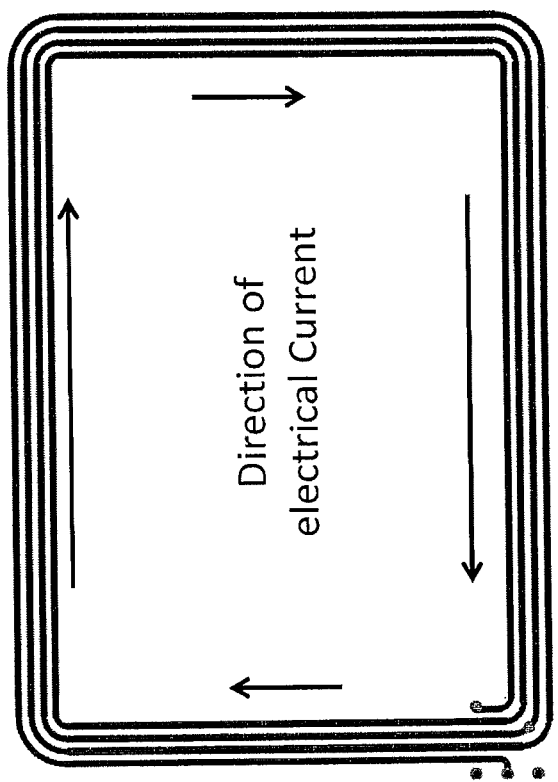
FIG. 1 shows a basic spiral loop coil.
Figure 2:
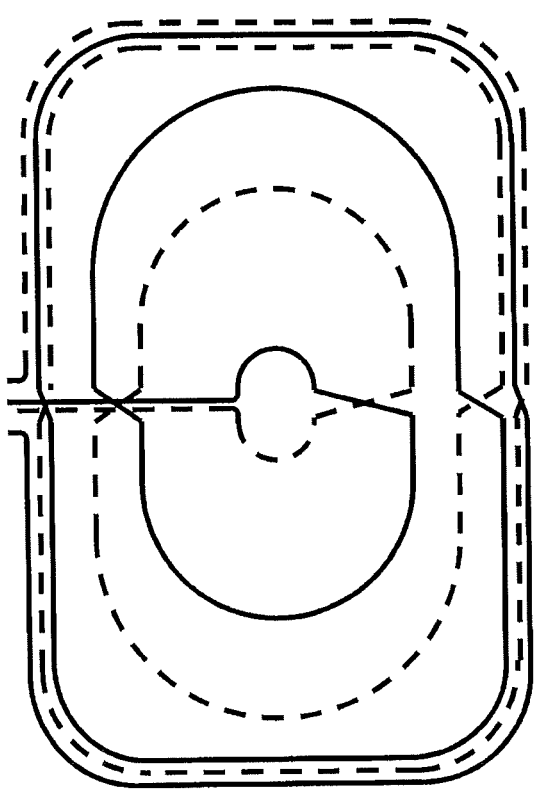
FIG. 2 shows a basic interleaved spiral loop coil comprising two interleaved loop windings.
Figure 3:
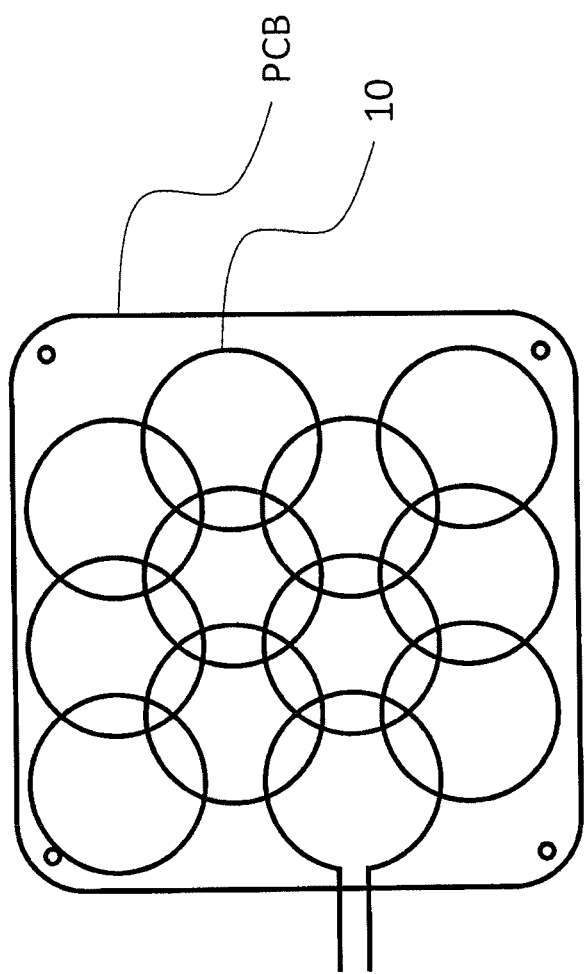
FIG. 3 shows a known multi-loop coil cluster.
Figure 4:
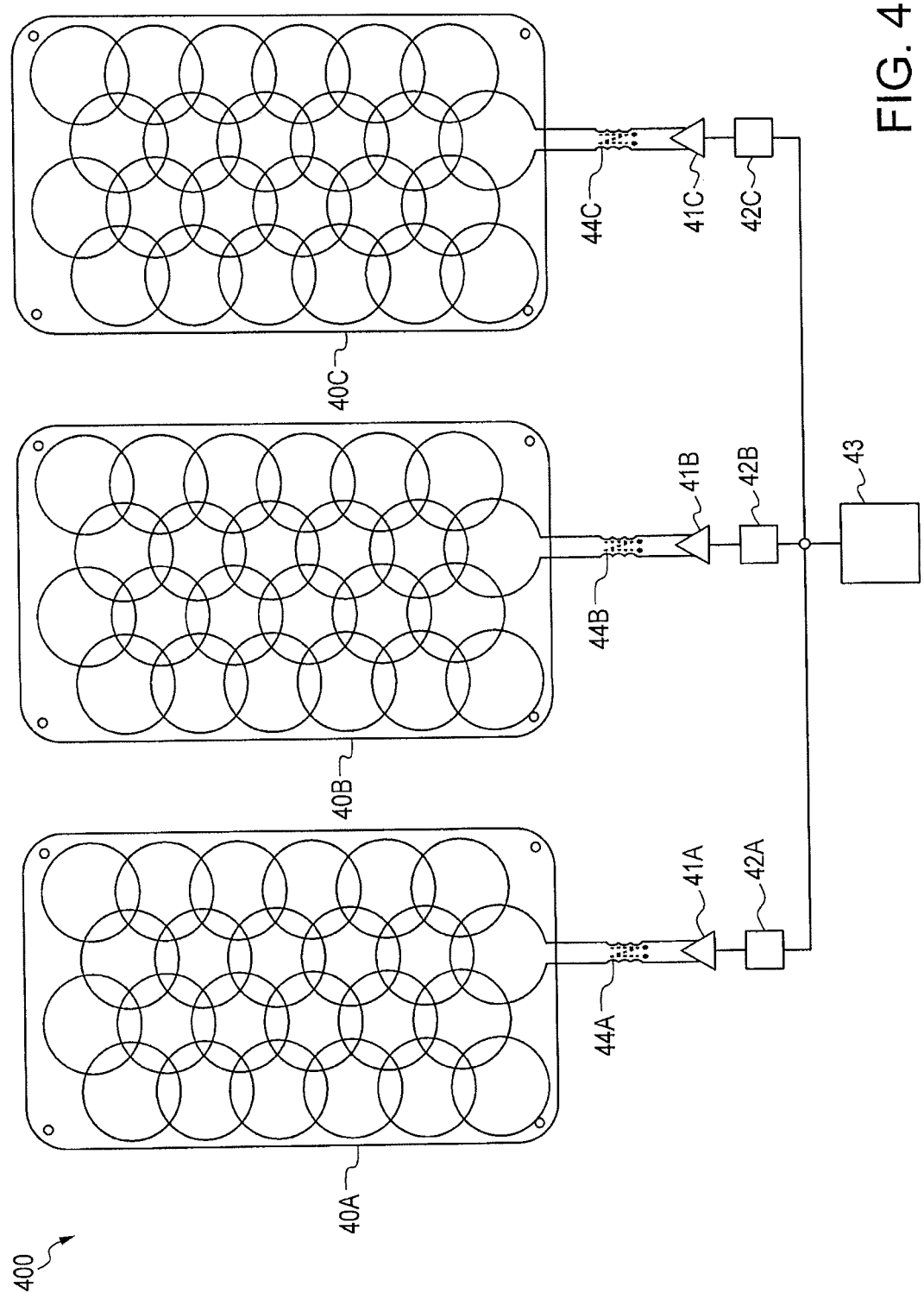
FIG. 4 shows a large area wireless power system according to one embodiment.

FIG. 4 shows a large area wireless power system 400 according to a first embodiment of the invention. The wireless power system 400 has three coils 40A, 40B, 40C, but more or fewer coils can be used based on the size of the area for which to provide power. While FIG. 4 and the following figures show the multiple-loop configuration of FIG. 3, coils 40A, 40B and 40C can be any coil type. Each coil is coupled to a respective wireless power amplifier 41A, 41B, 41C. Coils 40A, 40B, 40C scale in discrete steps but require precise synchronization between each of the wireless power amplifiers 41A, 41B, 41C to ensure that any load large enough to couple to two or more coils receives power in-phase from each of the coils. Moreover, the physical distance between the wireless power amplifiers, however, makes it difficult to distribute the synchronization signal with low jitter and timing distortion. In this regard, each wireless power amplifier is connected to a synchronization circuit 50 that includes a synchronization receiver 42A, 42B, 42C and synchronization transmitter 43. In addition, in this embodiment, the coils 40A, 40B, 40C are separated physically in such a manner to have a maximum coupling of −17 dB.

At 6.78 MHz, the ISM frequency for highly resonant wireless power applications, the large area of the coil clusters increases the capacitive coupling between them. This capacitive coupling provides a path for common-mode current. Common-mode currents lead to EMI issues, unwanted heating and degraded performance. To overcome these common-mode issues suitable common-mode chokes 44A, 44B, 44C are connected between the wireless power amplifiers 41A, 41B, 41C and coils 40A, 40B, 40C. Common-mode chokes 44A, 44B, 44C are preferably bifilar wound, and preferably use thick plastic insulation to reduce capacitance and therefore losses induced directly into the core material.

Figure 5:
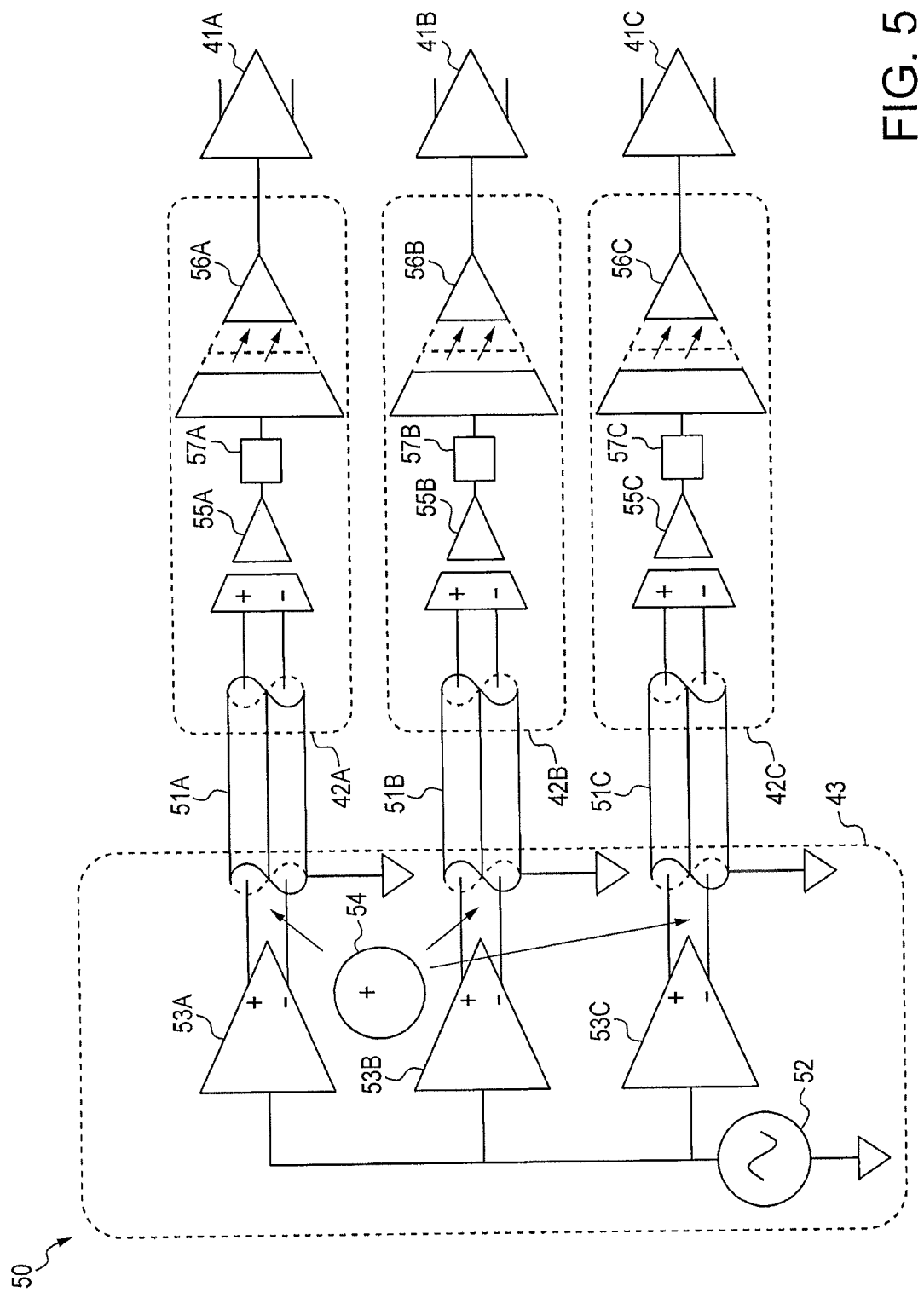
FIG. 5 shows a synchronization circuit according to one embodiment.

FIG. 5 shows a block diagram of the synchronization transmitter 43 and synchronization receivers 42A, 42B, 42C of FIG. 4, which together comprise synchronization circuit 50, according to the preferred embodiment. Synchronization circuit 50 includes synchronization transmitter 43 connected to multiple synchronization receivers 42A, 42B, 42C by differential transmission line pairs 51A, 51B, 51C. The synchronization transmitter 43 includes an oscillator 52 that provides the single-ended clock signal for the wireless power system 400, differential drivers 53A, 53B, 53C that convert the single-ended clock signal into differential signals, and a DC power source 54 that provides power to each differential transmission line pairs 51A, 51B, 51C. The frequency of the signal supplied by the oscillator 52 is preferably 6.78 MHz, the ISM band for highly resonant wireless power applications. Each synchronization receiver 42A, 42B, 42C includes a differential receiver 55A, 55B, 55C connected to an isolation driver 56A, 56B, 56C.

Differential transmission line pairs 51A, 51B, 51C are used to distribute the clock signal from oscillator 52 to each differential receiver 55A, 55B, 55C. Differential transmission line pairs 51A, 51B, 51C are used to provide immunity from the wireless power electromagnetic fields and have a fixed impedance, preferably 50Ω or 100Ω, that prevents reflections that can induce jitter and timing errors. Each synchronization receiver 42A, 42B, 42C receives a differential signal from the respective differential transmission line pair 51A, 51B, 51C and converts it to a single ended signal that is sent across an isolation barrier, in the form of isolated driver 56A, 56B, 56C, that is connected to the respective wireless power amplifier 41A, 41B, 41C. The output of each differential receiver 55A, 55B, 55C is fed to an isolated driver 56A, 56B, 56C to eliminate high frequency low impedance paths between each wireless power amplifier 41A, 41B, 41C. Each differential receiver 55A, 55B, 55C preferably receives DC power from the DC power source 54 through the respective differential transmission line pair 51A, 51B, 51C. Each isolated driver is preferably powered by the respective wireless power amplifier 41A, 41B, 41C.

When multiple coils are synchronized, cables of various lengths are required. Using cables of different lengths, however, can result in phase differences relative to the other signals at each receiver respectively. As described above, it is important that the various coils are in-phase. One way to address this issue is to use cables of the same length to connect the synchronization transmitter to the synchronization receiver. For coils that have only a short distance between the transmitter and receiver, however, this can result in cable being bunched up, which requires space for storing such bunched cable. As such, this solution is not desirable. Another solution is to include a delay compensation circuit 57A, 57B, 57C in each synchronization circuit, as shown in FIG. 5. Where the cable is shortest, the delay compensation circuit can be configured to add a longer delay. Where the cable is of medium length, the delay compensation circuit can be configured to add a medium delay. Where the cable is longest, no delay compensation circuit is necessary and serves as the delay reference for all the delay circuit settings. All added delays are intended to achieve the goal of minimal phase difference between the various signals with respect to each of the receivers, preferably no more than 200 ps.

Figure 6:
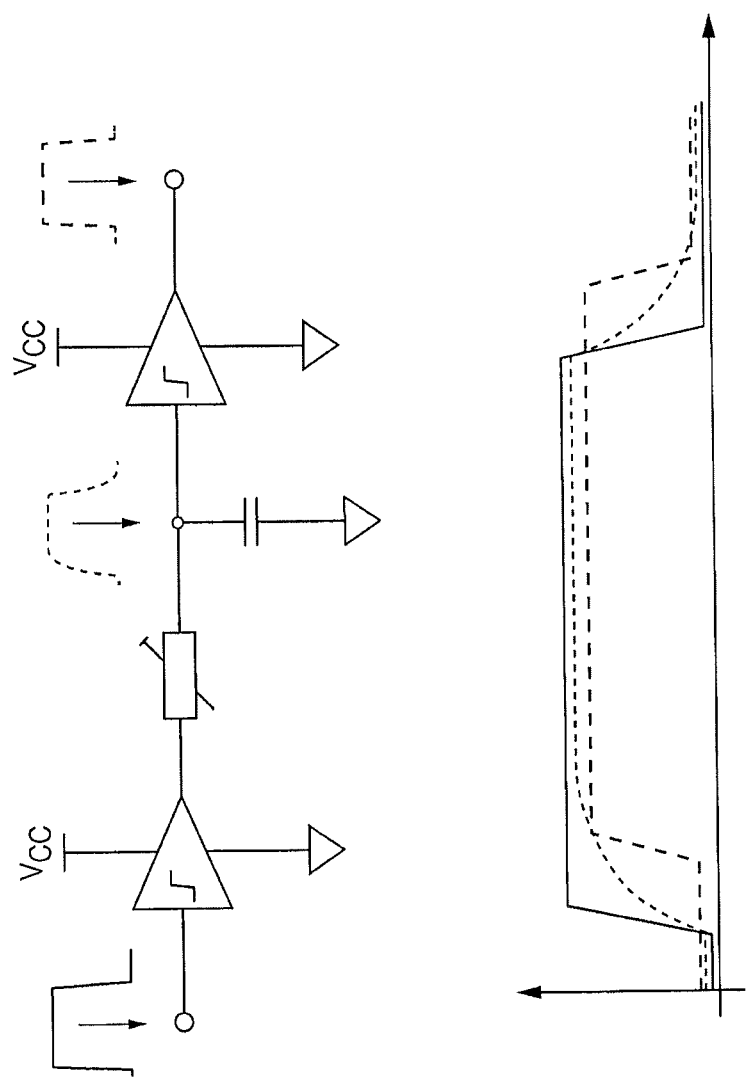
FIG. 6 shows a delay compensation circuit according to one embodiment.

The delay compensation circuit 57A, 57B, 57C is preferably placed between the differential receiver 55A, 55B, 55C and the isolated driver 56A, 56B, 56C, as shown in FIG. 5. The delay compensation circuit 57A, 57B, 57C may instead be placed after the isolated driver 56A, 56B, 56C and before the wireless power amplifier 41A, 41B, 41C, or between the oscillator 52 and differential drivers 53A, 53B, 53C of the synchronization transmitter 43. FIG. 6 shows an exemplary delay compensation circuit 57A, 57B, 57C, and illustrates in graphs how the exemplary delay compensation circuit operates to compensate for delay. The delay compensation circuit shown in FIG. 6 is exemplary, and any known delay compensation circuit can be used.

Figure 7:
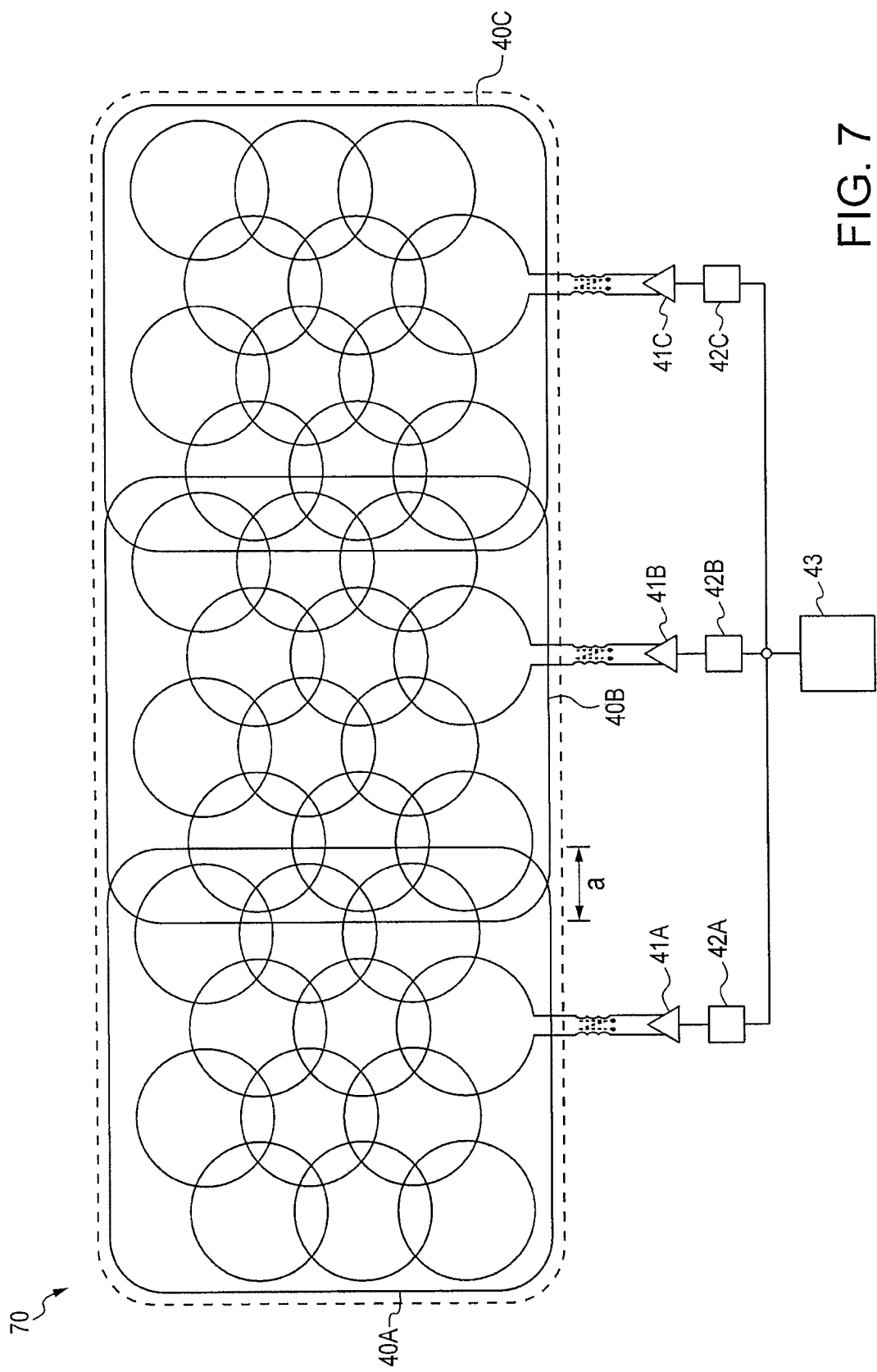
FIG. 7 shows an embodiment of a large area wireless power system.

FIG. 7 shows an alternative embodiment of the invention with wireless power system 70. Wireless power system 70 is nearly identical to wireless power system 400 (FIG. 4) except that the coils 40A, 40B, 40C partially overlap (e.g., by a distance a) as described in U.S. patent application Ser. No. 15/922,286.

Figure 8:
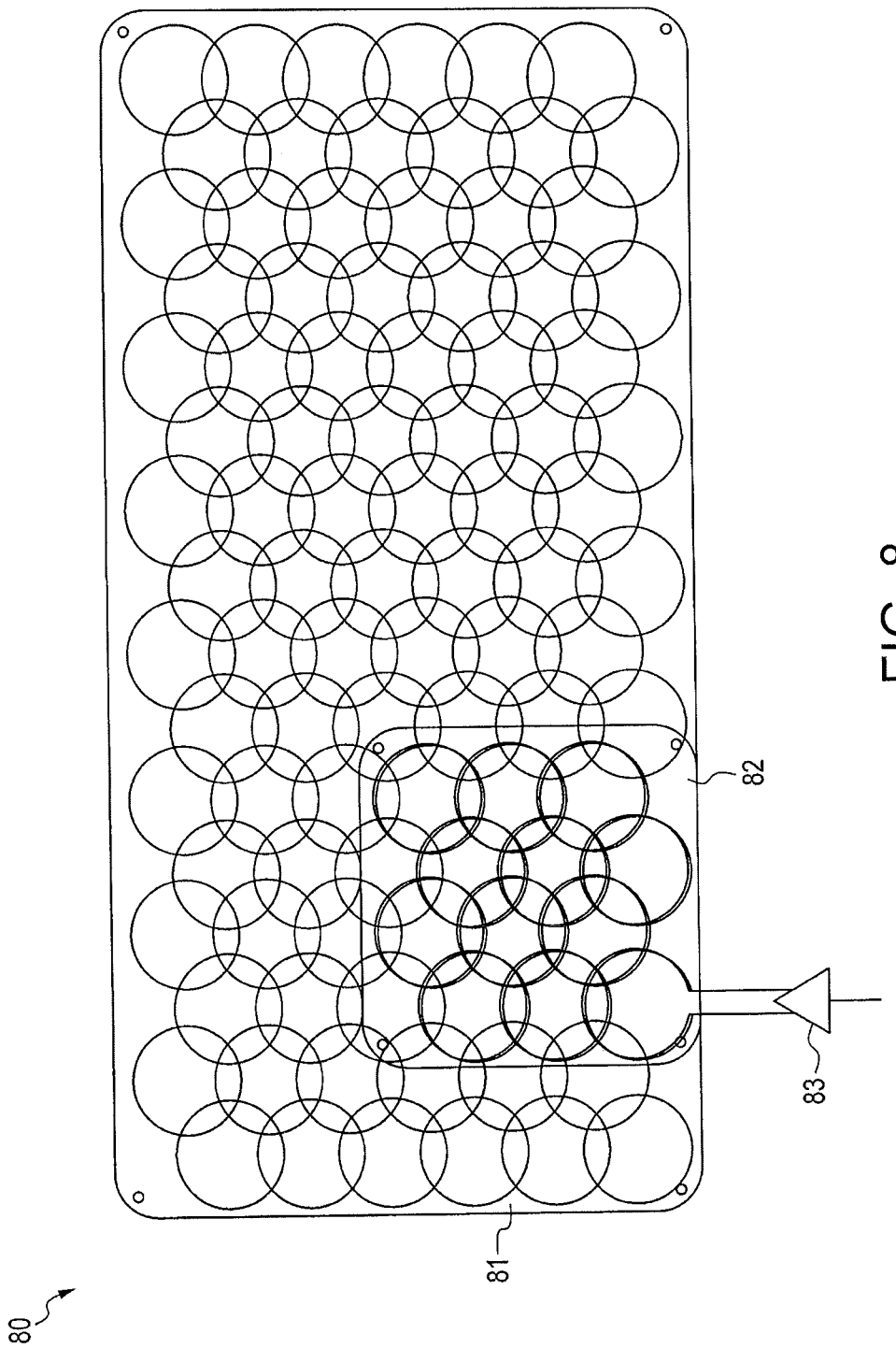
FIG. 8 shows an embodiment of a large area wireless power system.

FIG. 8 shows a large area wireless power system 80 according to another embodiment. Large area wireless power system 80 uses a resonant large area coil 81 and a smaller induction coil 82. The smaller induction coil 82, driven by a high current amplifier 83, induces a magnetic field into the resonant large area coil 81, and through resonance enhances the field. Smaller induction coil 82 is a high current primary, i.e., the current to drive the high power in the resonant large area coil 81 results in high current for the smaller induction coil and behaves like a current transformer. Smaller induction coil 82 may or may not be tuned. Resonant large area coil 81 is a lower current coil and is tuned.

The combination of the two coils 81, 82 in large area wireless power system 80 acts as a current transformer to yield the correct current. The main advantage of the two-coil approach of large area wireless power system 80 over the large area wireless power system 400 of FIG. 4 is that the resonant large area coil 81 can be designed to produce a uniform field without periodic small gaps over the power surface area. However, the two-coil approach of large area wireless power system 80 has limited ability to be scaled to a very large area due to the increase of induction coil area. It also requires that both the induction and resonant coils have characteristics suitable for a large area.

Figure 9:
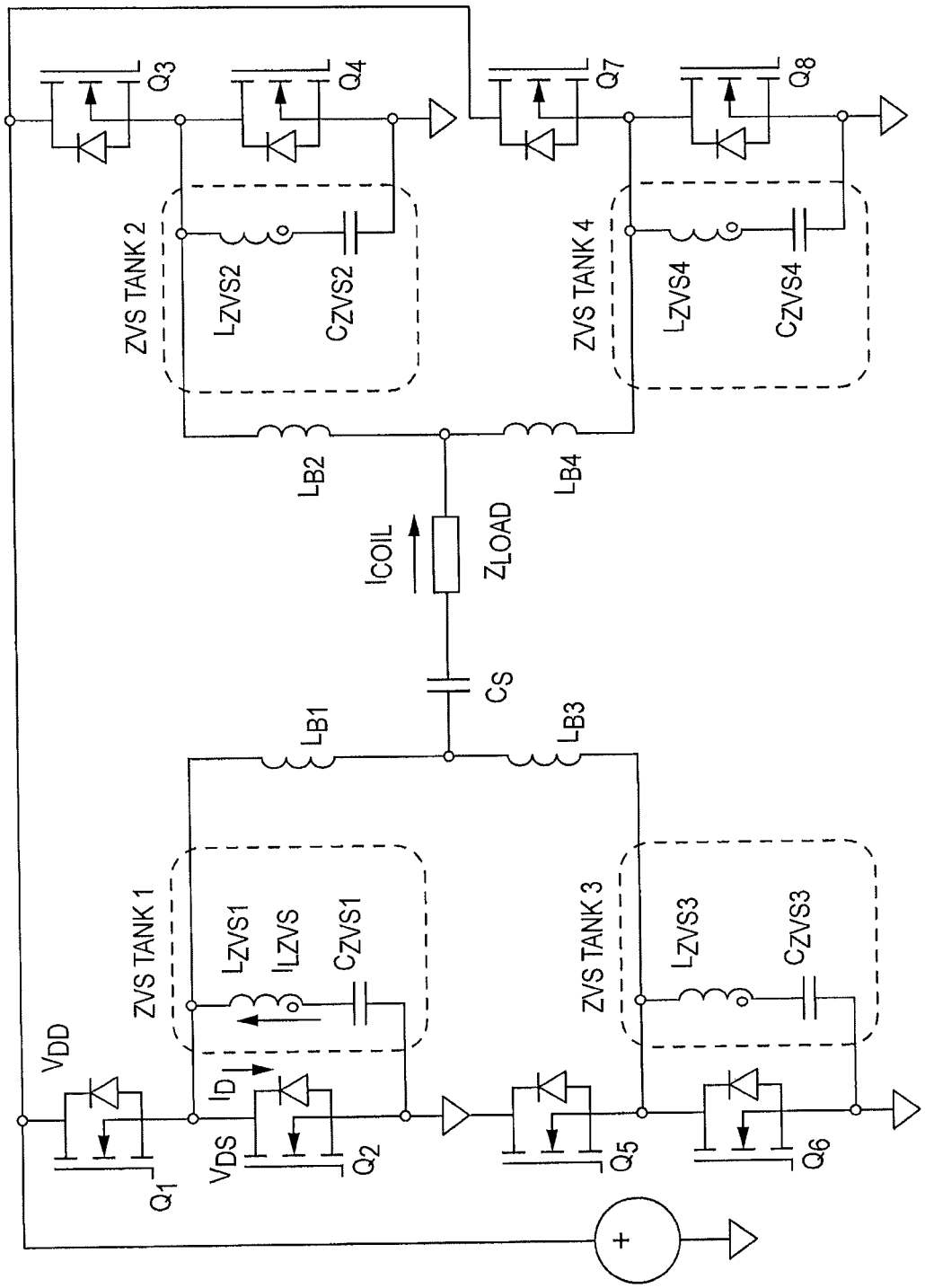
FIG. 9 shows an embodiment of paralleled high-current ZVS class D amplifiers.
Figure 10:
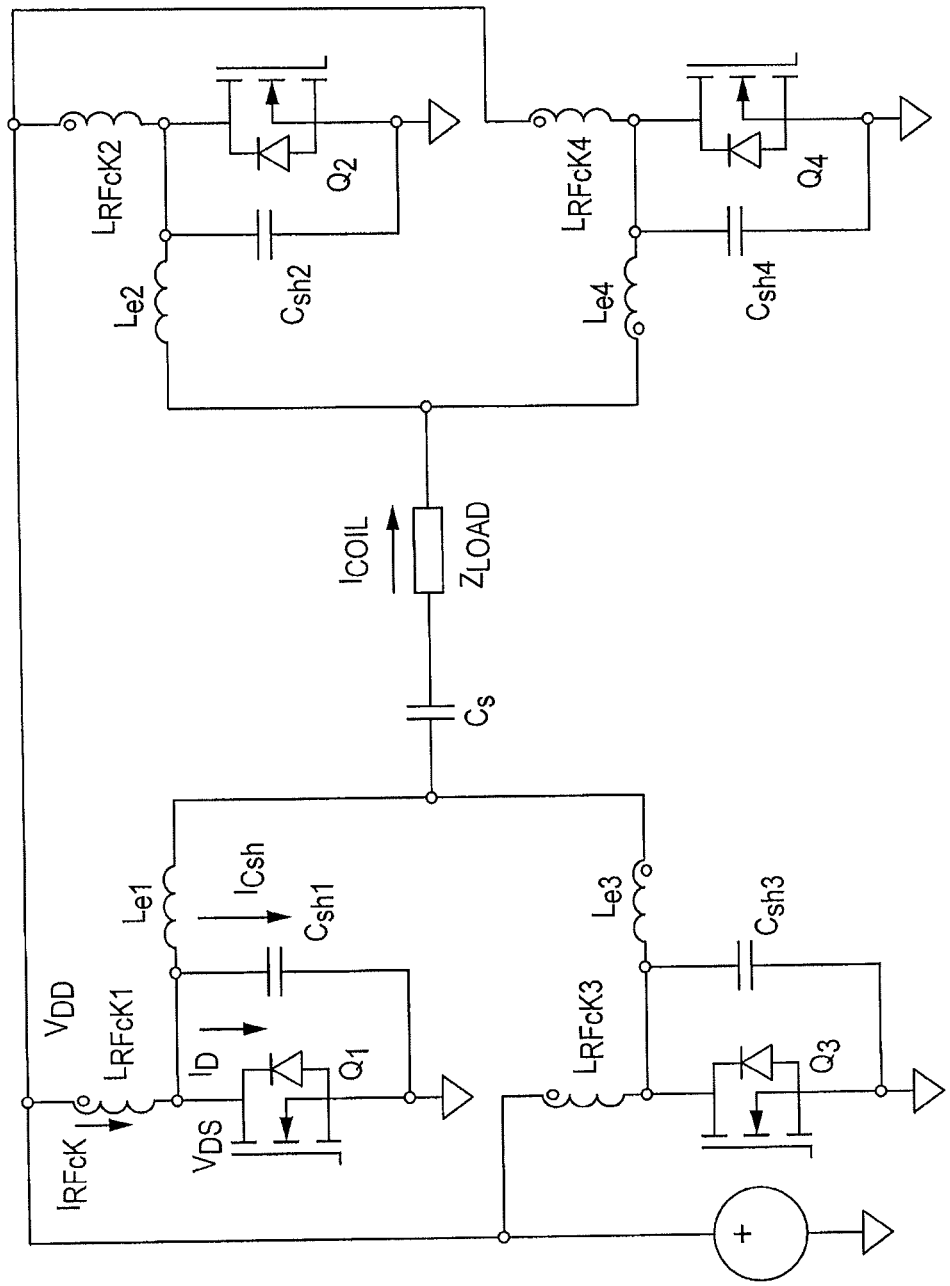
FIG. 10 shows an embodiment of paralleled high-current ZVS class E amplifiers.

High current amplifier 83 may be, for example, two differential-mode ZVS class D amplifiers arranged in parallel using current balancing inductors $L_{B1}$, $L_{B2}$, $L_{B2}$, $L_{B4}$, as shown in FIG. 9, to prevent circulating currents between the differential-mode ZVS class D amplifiers, or two differential-mode class E amplifiers arranged in parallel as shown in FIG. 10. In both of these cases, power to the coil is increased by increasing the current. Such paralleled amplifiers are described in more detail in U.S. Pat. No. 9,331,061, issued May 3, 2016, and incorporated by reference herein. The gate signal timing for each of the FETs used in each of the amplifier topologies of FIGS. 9 and 10 also require precise timing to prevent current imbalance or circulation that can lead to increased losses. This requires that low latency gate drivers be used together with equivalent signal transmission path lengths so that the signals arrive within a narrow window in a similar manner as with the delay compensation circuit 57A, 57B, 57C.

Figure 11:
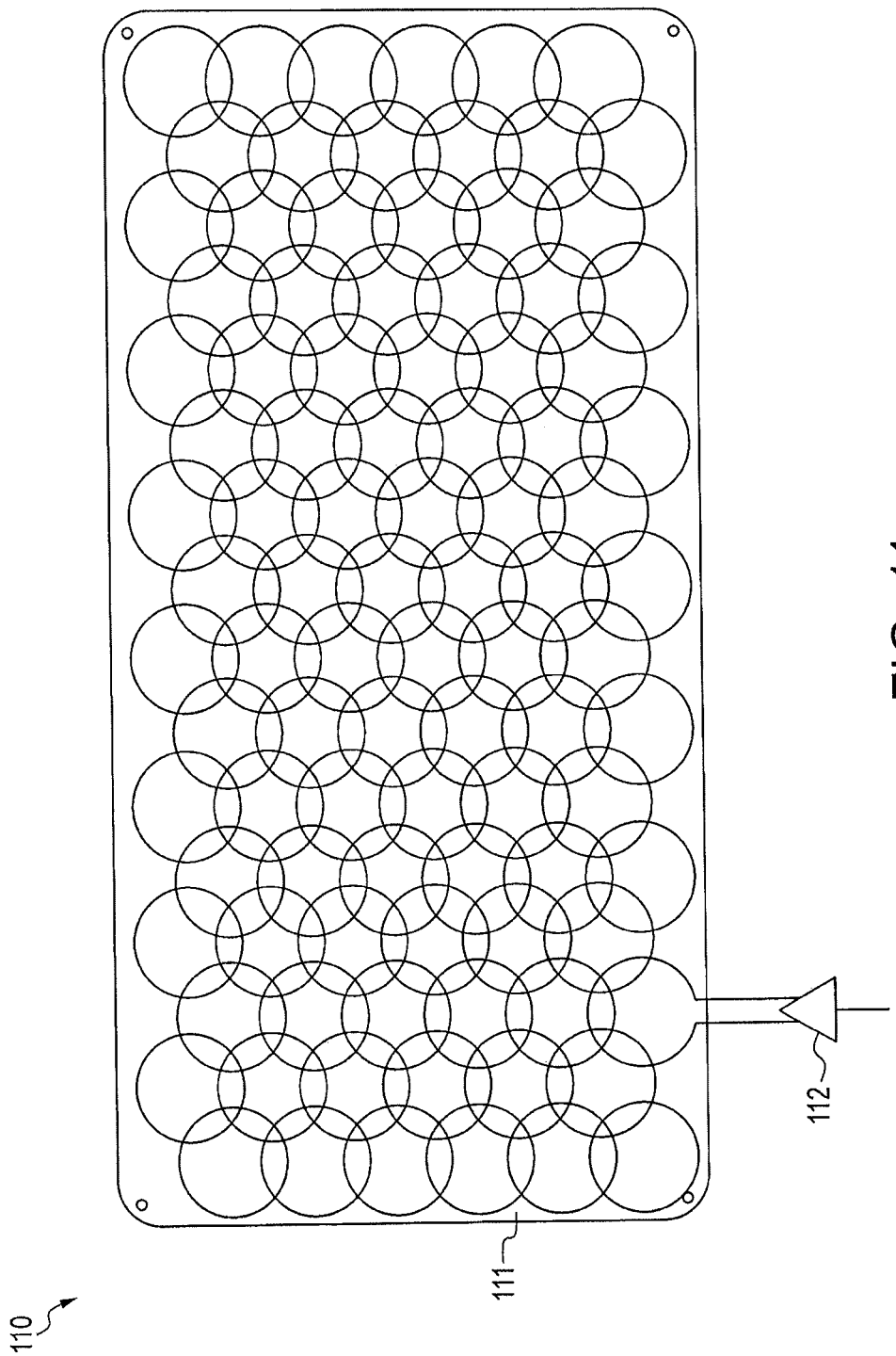
FIG. 11 shows an embodiment of a large area wireless power system.

FIG. 11 shows a large area wireless power system 110 according to another embodiment. Large area wireless power system 110 uses only a single large coil 111 that is powered by high-voltage amplifier 112. Wireless power system 110 overcomes the problems related to large coils by providing high enough driving voltage to induce sufficient current in the coil.

Figure 12:
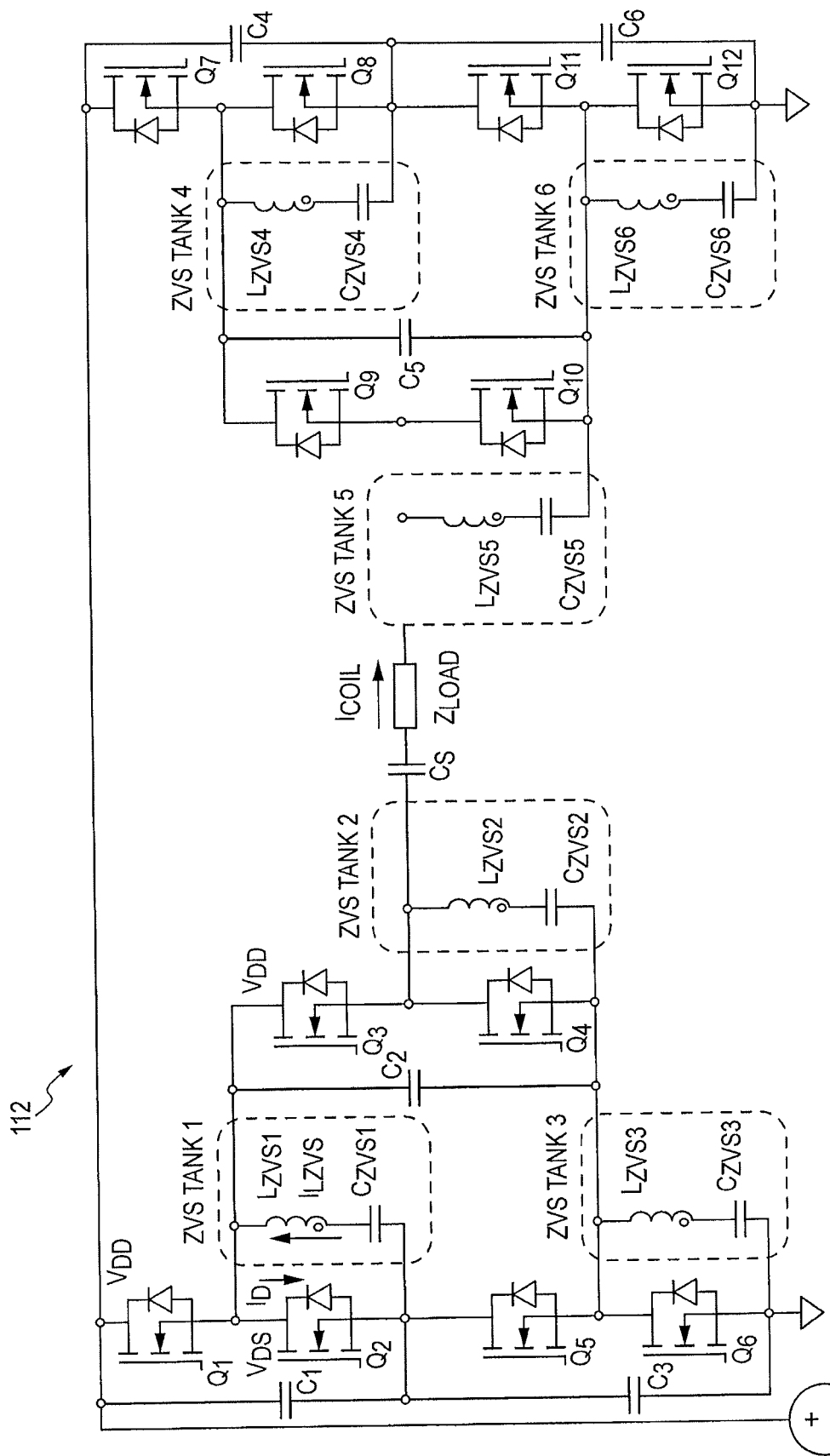
FIG. 12 shows an embodiment of a high-voltage multi-level ZVS class D amplifier.

FIG. 12 shows an exemplary embodiment of high-voltage amplifier 112. High-voltage amplifier 112 comprises multiple ZVS class D amplifiers stacked in a multi-level configuration, where all of the amplifiers need to be synchronously switched. Inherent to a multi-level converter, the high-voltage amplifier 112 allows for lower switching frequency, while increasing output frequency for the load. This keeps losses low for the many devices in the topology. This topology expands on the multi-level converter where the ZVS class D topology is use to ensure ZVS for each individual level (half bridge). While FIG. 12 shows a differential mode configuration, high voltage amplifier 112 can be singled-ended as well.

In the above detailed description, reference is made to certain embodiments. These embodiments are described with sufficient detail to enable those skilled in the art to practice them. It is to be understood that other embodiments may be employed and that various structural, logical, and electrical changes may be made. Moreover, while specific embodiments are described in connection with energy transfer systems, it should be understood that features described herein are generally applicable to other types of circuits. Accordingly, the present invention is intended to be limited only by the appended claims.

What is claimed is:

1. A large area wireless power system comprising:
a synchronization transmitter for generating a first single-ended clock signal and converting the first single-ended clock signal into a plurality of differential signals;
a plurality of synchronization receivers for receiving the plurality of differential signals from the synchronization transmitter and converting each received differential signal into a corresponding second single-ended signal;
a plurality of cables of various lengths ranging from a shortest cable to a longest cable, each of the cables comprising a differential transmission line pair for transmitting the differential signals from the synchronization transmitter to the synchronization receivers, wherein each of the synchronization receivers comprises a delay compensation circuit for compensating for differences in phase delay as the differential signals are transmitted through the cables of various lengths, the delay compensation circuit being configured to add a least amount of delay to the second single-ended signals corresponding to the differential signals transmitted through the longest cable, and to add a greatest amount of delay to the second single-ended signals corresponding to the differential signals transmitted through the shortest cable, such that the second single-ended signals are synchronized;
a plurality of high power amplifiers for receiving the plurality of synchronized second single-ended signals from the respective synchronization receivers and generating power; and
a plurality of wireless power coils for receiving the power generated by the plurality of high power amplifiers and wirelessly providing power.

2. The large area wireless power system of claim 1, wherein the synchronization transmitter comprises:
an oscillator for generating the first single-ended signal; and
a plurality of differential drivers for receiving the first single-ended signal and generating the plurality of differential signals.

3. The large area wireless power system of claim 1, wherein each synchronization receiver comprises:
a differential receiver for converting the plurality of differential signals to the plurality of second single-ended signals; and
an isolated driver for receiving the second single-ended signal and isolating the synchronization receiver from the respective high power amplifier.

4. The large area wireless power system of claim 3, wherein each differential receiver receives power from a respective one of the plurality of differential cables.

5. The large area wireless power system of claim 3, wherein the delay compensation circuit receives the second single-ended signal from the differential receiver and provides a phase-delay compensated signal to the isolated driver.

6. The large area wireless power system of claim 3, wherein the delay compensation circuit receives the second single-ended signal from the isolated driver and provides a phase-delay compensated signal to the high power amplifier.

7. The large area wireless power system of claim 1, wherein the plurality of wireless power coils are separated physically in such a manner to have a maximum coupling of −17 dB.

8. The large area wireless power system of claim 1, wherein the plurality of wireless power coils overlap.

9. An amplifier circuit for providing high power to a wireless power coil, the amplifier circuit comprising:
a differential receiver for receiving a differential signal from a differential driver, and converting the signal to a corresponding single-ended signal;
an isolated driver for receiving the single-ended signal and isolating the differential receiver;
a high power amplifier for receiving the single-ended signal and providing power to the wireless power coil; and
a delay compensation circuit for compensating for any phase delay in the single-ended signal before the signal is provided to the high power amplifier, the delay compensation circuit being configured to compensate for differences in phase delay as the differential signal is transmitted through one of a plurality of cables of various lengths ranging from a shortest cable to a longest cable, each of the cables comprising a differential transmission line pair, the delay compensation circuit being configured to add a least amount of delay to the single-ended signal corresponding to the differential signal passing through the longest cable, and to add a greatest amount of delay to the single-ended signal corresponding to the differential signal passing through the shortest cable, such that the single-ended signals are synchronized.

10. The amplifier circuit of claim 9, wherein the delay compensation circuit receives the single-ended signal from the differential receiver and provides a phase-delay compensated signal to the isolated driver.

11. The amplifier circuit of claim 9, wherein the delay compensation circuit receives the single-ended signal from the isolated driver and provides a phase-delay compensated signal to the high power amplifier.

12. A synchronization circuit for synchronizing a plurality of power signals provided to a plurality of power coils, the synchronization circuit comprising:
a synchronization transmitter for generating a single-ended clock signal and converting the single-ended clock signal to a plurality of differential signals;
a plurality of synchronization receivers for receiving the plurality of differential signals from the synchronization transmitter and converting the plurality of differential signals to a plurality of synchronized single-ended signals for driving the plurality of power coils;
a plurality of cables of various lengths ranging from a shortest cable to a longest cable, each of the cables comprising a differential transmission line pair for transmitting the differential signals from the synchronization transmitter to the synchronization receivers; and
a delay compensation circuit for compensating for differences in phase delay as the differential signals are transmitted through the cables of various lengths, the delay compensation circuit being configured to add a least amount of delay to the single-ended signal corresponding to the differential signals transmitted through the longest cable, and to add a greatest amount of delay to the single-ended signal corresponding to the differential signals passing through the shortest cable, such that the single-ended signals are synchronized.

13. The synchronization circuit of claim 12, wherein:
the synchronization transmitter comprises:
an oscillator for generating the single-ended signal; and
a plurality of differential drivers for receiving the single-ended signal and generating the plurality of differential signals.

14. The synchronization circuit of claim 13, wherein the delay compensation circuit receives the single-ended signal from the oscillator and provides a phase-delay compensated signal to the plurality of differential drivers.

15. The synchronization circuit of claim 12, wherein each synchronization receiver comprises:
- a differential receiver for converting the respective one of the plurality of differential signals to the respective one of the plurality of synchronized single-ended signals; and
- an isolated driver for receiving the respective one of the plurality of synchronized single-ended signals and isolating the synchronization receiver from a high-powered amplifier.

16. The synchronization circuit of claim 15, wherein the delay compensation circuit receives the synchronized single-ended signal from the differential receiver and provides a phase-delay compensated signal to the isolated driver.

17. The synchronization circuit of claim 15, wherein the delay compensation circuit receives the synchronized single-ended signal from the isolated driver and provides a phase-delay compensated signal to a high-powered amplifier.

* * * * *